(12) United States Patent
Theoduloz et al.

(10) Patent No.: US 10,312,910 B2
(45) Date of Patent: Jun. 4, 2019

(54) INTEGRATED CIRCUIT CONNECTION DEVICE

(75) Inventors: Yves Theoduloz, Yverdon (CH); Hugo Jaeggi, Fontaines (CH); Lubomir Plavec, Necin (CZ)

(73) Assignee: EM MICROELECTRONIC-MARIN SA, Marin (CH)

( * ) Notice: Subject to any disclaimer, the term of this patent is extended or adjusted under 35 U.S.C. 154(b) by 0 days.

(21) Appl. No.: 13/055,580

(22) PCT Filed: Jul. 23, 2009

(86) PCT No.: PCT/EP2009/059522
§ 371 (c)(1),
(2), (4) Date: Apr. 8, 2011

(87) PCT Pub. No.: WO2010/010162
PCT Pub. Date: Jan. 28, 2010

(65) Prior Publication Data
US 2011/0175665 A1    Jul. 21, 2011

(30) Foreign Application Priority Data
Jul. 25, 2008  (EP) .................................... 08161218

(51) Int. Cl.
*H03K 19/003* (2006.01)
*H03K 19/00* (2006.01)
(Continued)

(52) U.S. Cl.
CPC ... *H03K 19/00315* (2013.01); *H03K 19/0027* (2013.01); *H03K 19/018521* (2013.01)

(58) Field of Classification Search
CPC ....... H03K 19/0027; H03K 19/018521; H03K 19/00315
(Continued)

(56) References Cited

U.S. PATENT DOCUMENTS 5,574,389 A    11/1996  Chu
6,149,319 A    11/2000  Richter et al.
(Continued)

FOREIGN PATENT DOCUMENTS

EP          1 369 997 A2     12/2003

*Primary Examiner* — Lincoln D Donovan
*Assistant Examiner* — Colleen J O Toole
(74) *Attorney, Agent, or Firm* — Sughrue Mion, PLLC

(57) ABSTRACT

The integrated circuit connection device (1) enables an external component to be connected. The integrated circuit is powered by a supply voltage ($V_{DD}$) and part of the circuit operates using at least one internal regulated voltage ($V_{REG}$). The connection device includes two active transistors (N1, P1) of different conductivity connected in series between the supply voltage ($V_{DD}$) and earth ($V_{SS}$). The drains of these two active transistors (N1, P1) are connected to each other so as to form an external contact pad (2). The gates of these active transistors are controlled by voltage signals that have the same amplitude ($V_{esd}$). The connection device further includes switching means (3) for modifying the control signals ($V_{esd}$) applied across the active transistor gates, without exceeding the highest voltage between the supply voltage ($V_{DD}$) and the internal regulated voltage ($V_{REG}$). This allows the voltage range of said integrated circuit to be adapted to an external component connected to the external contact pad (2).

13 Claims, 2 Drawing Sheets

(51) Int. Cl.
*H03K 19/018* (2006.01)
*H03K 19/0185* (2006.01)

(58) Field of Classification Search
USPC .............. 326/80, 81, 83, 86; 327/112, 333
See application file for complete search history.

(56) References Cited

U.S. PATENT DOCUMENTS

| | | | | |
|---|---|---|---|---|
| 6,208,167 | B1* | 3/2001 | Ranjan et al. | 326/81 |
| 6,344,958 | B1 | 2/2002 | Morrill | |
| 7,295,040 | B1* | 11/2007 | Nguyen et al. | 326/83 |
| 2002/0175743 | A1 | 11/2002 | Ajit | |
| 2007/0085576 | A1* | 4/2007 | Sanchez | 327/112 |

* cited by examiner

INTEGRATED CIRCUIT CONNECTION DEVICE

CROSS REFERENCE TO RELATED APPLICATIONS

This application is a National Stage of International Application No. PCT/JP2009/059522 filed on Jul. 23, 2009, which claims priority from European Patent Application No. 08161218.6, filed on Jul. 25, 2008, the contents of all of which are incorporated herein by reference in their entirety.

The invention concerns an integrated circuit connection device for connecting an external component. The integrated circuit is powered by a supply voltage and one part of the circuit operates using at least one internal regulated voltage. The connection device includes two active transistors of different conductivity series-connected between the supply voltage and earth. The drains of these two active transistors are connected to each other so as to form an external contact pad, and the gates of the active transistors are controlled by voltage signals having the same amplitude.

BACKGROUND OF THE INVENTION

Integrated circuit connection devices are known in the prior art. Indeed, integrated circuits are generally fitted with connection devices enabling the connection of external components and communication between the external element and said integrated circuit.

These connection devices consist of two active MOS (PMOS and NMOS) transistors in an inverter arrangement to form a buffer. Thus the gates of the two transistors, forming the inverter input, are connected to the supply voltage and earth of the integrated circuit. The transistors drains, forming the inverter output, represent the external contact pad across which an external component will be connected.

One problem of these connection devices is that only components whose voltage level is lower than or equal to the voltage applied to the gate of the MOS transistors can be connected. In other words, the operating voltage of the external components must not be higher than the integrated circuit supply voltage. However, the object of this type of connection device is for the PMOS transistor of the buffer to always be non-conductive while the voltage applied across the drains is lower than the voltage applied across the gates.

Indeed the buffer is always non conductive as long as the voltage of the connected external component is lower than or equal to the gate voltage which is generally close to the supply voltage. If an external component whose operating voltage is higher than the PMOS transistor gate voltages is connected, the buffer is liable to no longer be non conductive.

Buffer conductivity can cause a current increase in the PMOS transistor of the inverter. This can lead to a current injection from the external component into the integrated circuit supply voltage. This current injection then introduces noise in the supply voltage and excessive power consumption.

Moreover, the current tendency in electronics is to reduce circuit supply voltages. This tendency is incompatible with having external component operating voltages that are lower than or equal to the MOS transistor gate voltages.

Integrated circuit connection devices that have a protection system if the voltage applied to the contact pad is higher than the operating voltage of said circuit are also known from U.S. Pat. No. 5,574,389.

SUMMARY OF THE INVENTION

It is one of the objects of the present invention to provide an integrated circuit connection device that overcomes the aforementioned drawbacks of the prior art.

The invention therefore concerns the connection device according to the above preamble, characterized in that the connection device further includes switching means for modifying the amplitude level of the voltage signals applied across the gates of the active transistors, without exceeding the highest voltage between the supply voltage or the internal regulated voltage, so as to adapt said integrated circuit voltage range to an external component connected to the external contact pad.

Owing to this feature, the device enables connection of external components operating at different operating voltages from the supply voltage, and notably external components whose operating voltage is higher than the integrated circuit supply voltage, to said integrated circuit, via the external contact pad. This is because it is not necessarily the supply voltage that is applied to the gates of the MOS transistors.

Advantageous embodiments of the connection device form the subject of the dependent claims 2 to 10.

One advantage of the present invention is that the device allows improved protection of the integrated circuit. Indeed, by being capable of operating at different voltage levels, the device according to the present invention can switch the MOS transistor gate voltage from one value to another. Thus, if the supply voltage and the voltage of the connected component are very close, the ability to switch to a different voltage range means that noise problems due to conductivity of the integrated circuit buffer are avoided.

Another advantage of the device of the present invention is that it allows flexibility in the use of the integrated circuit. Indeed, this invention enables components with different voltage levels to be connected to an integrated circuit. This flexibility becomes very advantageous in the event that one wishes to use reduced supply voltage. Indeed, in the prior art, the supply voltage constitutes an upper limit for the operating voltage of the connected external component. If this limit is exceeded, noise from the current injection appears across the supply voltage. It will thus be clear that the device according to this invention enables reduced supply voltage to be used but without having to limit the voltage levels of the connected components.

BRIEF DESCRIPTION OF THE DRAWINGS

The objects, advantages and features of the connection device will appear more clearly in the following detailed description of at least one embodiment of the invention given solely by way of non-limiting example and illustrated by the annexed drawings, in which.

DETAILED DESCRIPTION OF THE INVENTION

In the following description, all those parts of the integrated circuit that are well known to those skilled in the art in this technical field will be described only in a simplified manner.

Figure 1:
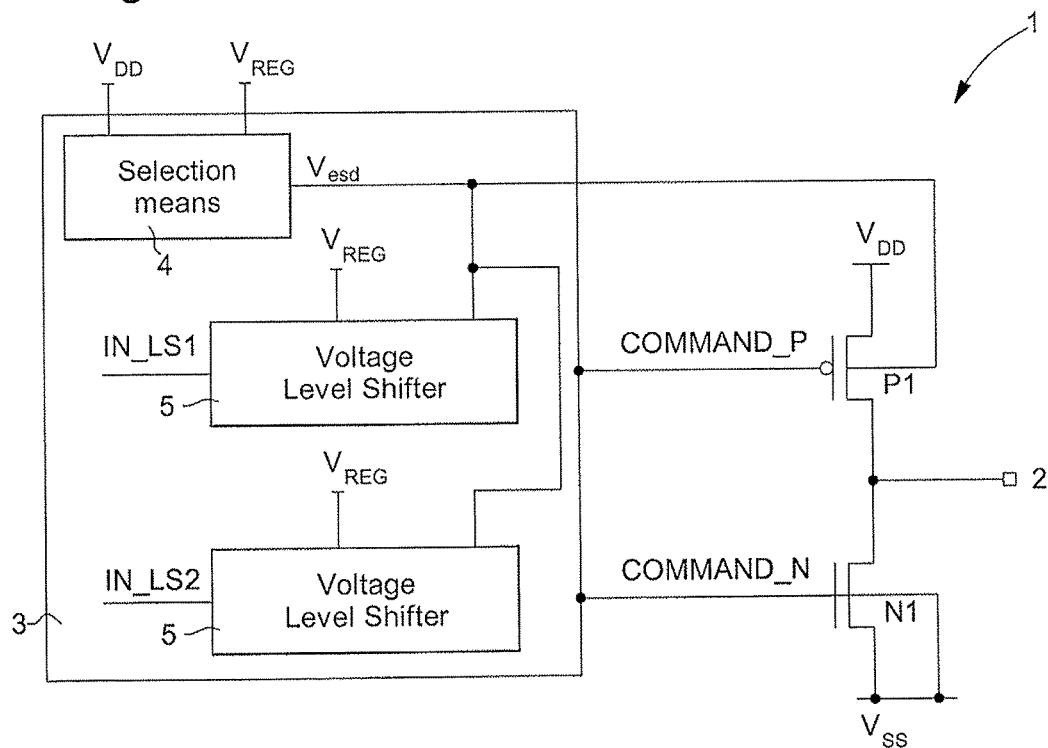
FIG. 1 shows schematically the connection device according to the present invention.

FIG. 1 shows schematically connection device 1 according to the present invention. This device 1 includes a buffer formed of two active transistors. The buffer includes more specifically one transistor P1 and one transistor N1 connected in series. Thus, the drains of the two transistors N1, P1 are connected to each other, whereas the source of transistor P1 is connected to supply voltage $V_{DD}$ and the source and well of transistor N1 is connected to earth $V_{SS}$. The drains of both transistors are also connected to external contact pad 2 where an external component can be connected. The gates of these transistors N1, P1 are connected to the same potential, while the well of transistor P1 is biased at a voltage corresponding to the maximum amplitude value of the voltage signals controlling transistors N1 and P1.

This arrangement thus guarantees that the logic level "1" is equal to $V_{DD}$, when supply voltage $V_{DD}$ is connected to the source of transistor P1. Moreover, this arrangement guarantees that the buffer is non-conductive when the voltage applied across external contact pad 2 is lower than or equal to the potential applied across the gates of transistors N1 and P1. As previously stated, if the voltage applied to the external contact pad 2 is higher than the gate voltage, then the buffer is unlikely to still be non-conductive. It must, however, be understood that the voltage of the external component being connected across external contact pad 2 must never be higher than the voltage applied to the gates of transistors N1 and P1.

This is why this invention also includes means for applying a voltage higher than $V_{DD}$ to the external contact pad 2 without making the buffer conductive. To achieve this, connection device 1 includes switching means 3 for altering the potential value applied to the gates of transistors N1 and P1 so as to adapt it to the voltage applied across external contact pad 2. This switching means 3 includes selection means 4 and conversion means 5.

Nonetheless, to alter the value of the potential applied to the gates of transistors N1 and P1, it must be possible to generate the different voltages that one wishes to apply. This is why the integrated circuit is provided with means for generating these different internal voltages. This may include various means such as, for example, one or several DC-DC converters. Of course, these voltages may serve other functions in the integrated circuit, such as powering switching means 3.

In a preferred embodiment, transistor P1 is a PMOS transistor and transistor N1 is an NMOS transistor. The circuit is powered by a supply voltage $V_{DD}$ and includes means for generating a regulated internal voltage $V_{REG}$. Thus, to alter the voltage range of external contact pads 2 of the integrated circuit, switching means 3 will alter the potential of the gates of active transistors N1, P1 with one or other of the two voltages $V_{DD}$ or $V_{REG}$. This thus allows several possible voltage ranges in the buffer. Preferably, it is the higher of the two voltages that is selected. Thus, this means that the largest voltage range is always available and thus a larger choice of external circuit voltage to be connected.

Selection means 4 takes the form of a voltage comparator 4 which will compare $V_{DD}$ and $V_{REG}$ in order to select the highest voltage. Comparator 4 then delivers, at output, a voltage $V_{esd}$ of equal value to the highest voltage between $V_{REG}$ and $V_{DD}$. This voltage $V_{esd}$ is then transmitted to conversion means 5 and to the well of transistor P1 in order to control the buffer. Conversion means 5 is used to alter the voltage level of the input signals IN_LS1 and IN_LS2 to supply transistor control signals COMMAND_N and COMMAND_P applied across the gates of transistors N1, P1 and setting them at voltage $V_{esd}$. Of course, voltage $V_{esd}$ could be selected automatically as a function of the external component voltage applied to external contact pad 2. Thus, voltage comparator 4 immediately selects the voltage which is higher than that of the external component. This then enables the integrated circuit to adapt automatically to the external component voltage and thus prevents the buffer from becoming conductive.

Conversion means 5 takes the form of a voltage level shifter which converts the input control signals from the integrated circuit working at voltage $V_{REG}$ to adapt their output voltage level to voltage $V_{esd}$.

Figure 2:
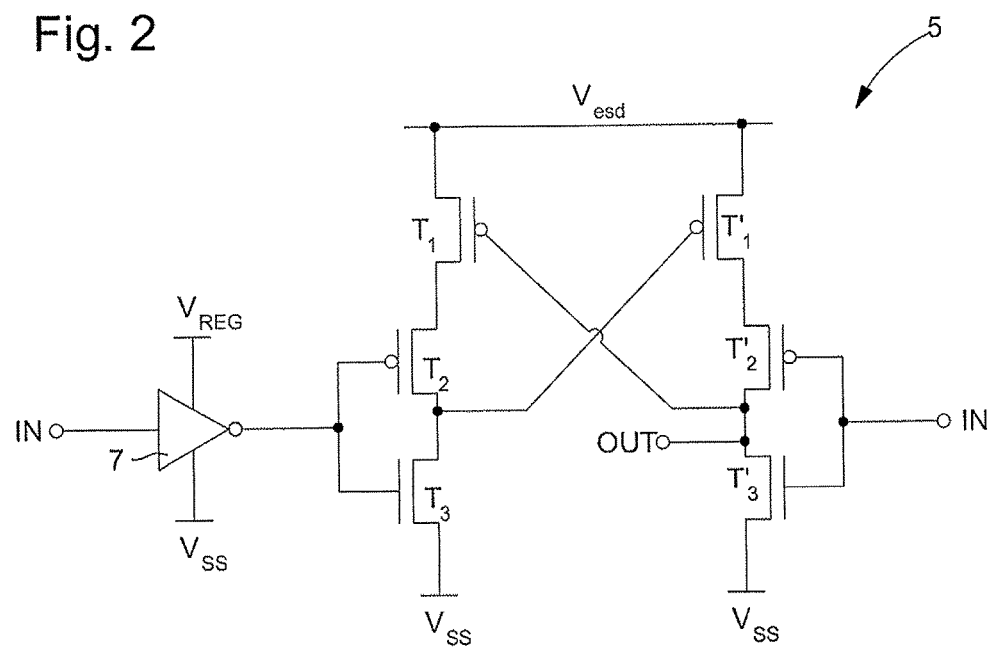
FIG. 2 shows schematically the voltage shift device used.

These voltage level shifters, 5 shown in FIG. 2, include an input IN opening into an inverter 7 powered by $V_{REG}$ and a transistor system. This system is jointed into two symmetrical branches each including three active transistors. Each branch thus includes two P type transistors called T1, T2 in the first branch and T1, T'2 in the second branch, and an N type transistor called T3 in the first branch and T'3 in the second branch. Each transistor T3, T'3 is respectively connected in series with a transistor T2, T'2, and the source of transistors T3, T'3 is connected to earth $V_{SS}$. Transistors T1, T1 are series connected with transistors T2, T'2 and powered by $V_{esd}$ at the source thereof. The gates of transistors T2 and T3 are connected to each other at the output of inverter 7. The gates of transistors T'2 and T'3 are connected to each other at the input IN of inverter 7. The drains of transistors T2 and T3 are connected to each other at the gate of transistor T1. The drains of transistors T'2 and T'3 are connected to each other at the gate of transistor T1, these drains also forming the output OUT of the voltage level shifter.

When the circuit is operating, if inverter input IN is at logic level "1", the inverter output is thus at logic level "0". The application of this logic level "0" across the gate of transistors T2 and T3 causes transistor T2 to change to conductive mode and transistor T3 to change to non-conductive mode. Moreover, the application of the inverter input signal across the gate of transistors T'2 and T'3 causes transistor T'2 to change to non-conductive mode and transistor T'3 to conductive mode. Because transistor T'3 is conductive and the drains of T'2 and T'3 are connected to the gate of transistor T1, this allows said gate of transistor T1 to be connected to earth $V_{SS}$, rendering the latter conductive. Given that transistors T1 and T2 are conductive, voltage $V_{esd}$ passes through said transistors. Since the drain of transistor T2 is connected to the gate of transistor T'1, voltage $V_{esd}$ is then applied across the gate of transistor T1. Transistor T1 then becomes non-conductive. The output OUT of the voltage level shifter, which is the connection point of the drains of transistors T'2 and T'3, is then earth $V_{SS}$. Conversely, when the inverter input IN is at logic level "0", transistors T1, T2 and T'3 become non-conductive whereas transistors T3, T1 and T'2 become conductive. This then allows the voltage level shifter output OUT to be at $V_{esd}$.

Figure 3:
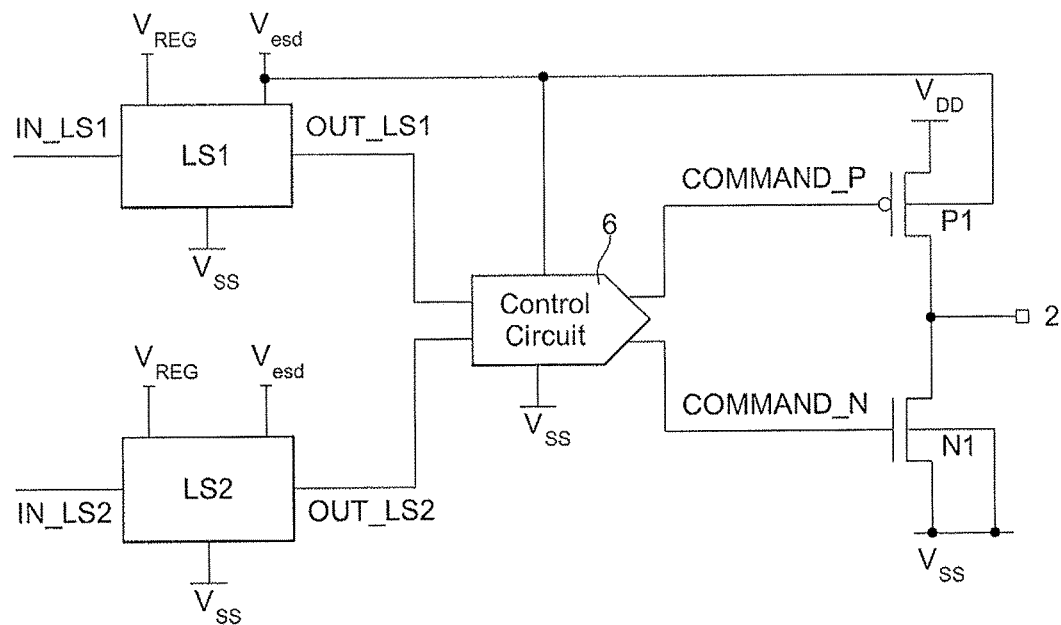
FIG. 3 shows schematically the connection device according to a preferred embodiment.

The diagram of FIG. 3 shows two voltage level shifters LS1 and LS2. The first LS1 of these shifters is the one that shifts the control signal voltage levels of said transistors N1 and P1. A signal IN_LS1 for controlling the transistors is applied to the input of shifter LS1. The second LS2 of these shifters is used to set said output buffer in high impedance mode. This mode is characterized in that the logic level of said external contact pad 2 is neither at logic level "1" nor at logic level "0". This state avoids creating interference at the other terminals of the integrated circuit. This shifter LS2 receives at input a control signal IN_LS2 for setting it in high impedance mode The output signals OUT_LS1 and OUT_LS2, at voltage $V_{esd}$ are sent across a control circuit 6. Control circuit 6 is responsible for applying control signals COMMAND_N and COMMAND_P to said gates of transistors P1 and N1 in order to render them conductive or non-conductive in high impedance mode.

This control circuit 6 further includes means for applying the control signals to the gates without any overlap. In practice, control circuit 6 first of all makes one of transistors N1 or P1 non-conductive before making the other conductive. This is so that the two transistors are not conductive at the same time.

Evidently, some preferred arrangements may be provided, such as making $V_{REG}$ higher than $V_{DD}$. This arrangement also allows supply voltage $V_{DD}$ to be reduced while maintaining the possibility of connecting external components whose voltage is higher than $V_{DD}$ but lower than $V_{REG}$.

In another embodiment, the integrated circuit can generate a higher number of internal regulated voltages than two. This multiplicity allows finer adjustment of the voltage applied to transistor N1, P1 in accordance with the external component voltage. Moreover, this allows the buffer a higher number of possible voltage ranges, thereby increasing the flexibility of the integrated circuit.

Further, the selection of the voltage applied to the transistor gates may be made by by a manual selector instead of a voltage detector.

It will be clear that various alterations and/or improvements and/or combinations evident to those skilled in the art may be made to the various embodiments of the invention set out above without departing from the scope of the invention defined by the annexed claims.

The invention claimed is:

1. An integrated circuit connection device for connecting an external component, said integrated circuit being powered by a supply voltage and one part of the circuit operating using at least one internal regulated voltage, said connection device including two active transistors of different conductivity series connected between the supply voltage and earth, the drains of these two active transistors being connected to each other so as to form an external contact pad, the gates of said active transistors being intended to be controlled by voltage signals having the same amplitude at different times such that the active transistors are opened and closed without any overlap and are not conductive at the same time, wherein the connection device further includes switching means connected to the gates of the active transistors, to the supply voltage, and to said at least one internal regulated voltage, for modifying the amplitude level of the voltage signals applied across the gates of the active transistors, without exceeding the highest voltage between the supply voltage and the internal regulated voltage so as to adapt the voltage level applied to the gates of the active transistors to the voltage level of an external component connected to the external contact pad, wherein the switching means includes selection means for giving the voltage signals to be applied to the gates of said active transistors either the voltage level matching the supply voltage, or the voltage level matching the internal regulated voltage, the higher of the two voltages being selected.

2. The connection device according to claim 1, wherein a first active transistor is of the NMOS type and a second transistor is of the PMOS type.

3. The connection device according to claim 1, wherein the switching means also includes conversion means for adapting the amplitude level of the voltage signals to control the transistors with the selected voltage.

4. The connection device according to claim 2, wherein the switching means also includes conversion means for adapting the amplitude level of the voltage signals to control the transistors with the selected voltage.

5. The connection device according to claim 1, wherein said connection device includes a voltage level shifter receiving at input a first transistor gate control signal which operates at the internal regulated voltage, and supplying at output a first output signal to a control circuit, which will process said first output signal and apply the control signals working at the selected voltage to the transistors.

6. The connection device according to claim 2, wherein said connection device includes a voltage level shifter receiving at input a first transistor gate control signal which operates at the internal regulated voltage, and supplying at output a first output signal to a control circuit, which will process said first output signal and apply the control signals working at the selected voltage to the transistors.

7. The connection device according to claim 5, wherein said connection device includes a second voltage level shifter, receiving at input a second transistor gate control signal which operates at the internal regulated voltage, and supplying at output a second output signal to the control circuit, which will process said second output signal so as to apply the control signals to the transistors to set said transistors in high impedance mode.

8. The connection device according to claim 6, wherein said connection device includes a second voltage level shifter, receiving at input a second transistor gate control signal which operates at the internal regulated voltage, and supplying at output a second output signal to the control circuit, which will process said second output signal so as to apply the control signals to the transistors to set said transistors in high impedance mode.

9. The connection device according claim 1, wherein the voltage level is manually selected.

10. The connection device according claim 2, wherein the voltage level is manually selected.

11. The connection device according to claim 1, wherein the voltage level is selected automatically.

12. The connection device according to claim 2, wherein the voltage level is selected automatically.

13. The connection device according to claim 2, wherein the PMOS transistor includes a well, which is biased at a voltage corresponding to the maximum amplitude value of the voltage signals.

* * * * *